United States Patent

Kan

[15] 3,668,430

[45] June 6, 1972

[54] HIGH SPEED LOGIC CIRCUIT WITH LOW EFFECTIVE MILLER CAPACITANCE

[72] Inventor: David T. Kan, Santa Clara, Calif.

[73] Assignee: Signetics Corporation, Sunnyvale, Calif.

[22] Filed: July 12, 1971

[21] Appl. No.: 161,476

[52] U.S. Cl. ..............................307/235, 307/215, 307/218, 328/146, 330/30 D

[51] Int. Cl. ....................................H03k 19/30, H03k 19/34

[58] Field of Search..................307/213, 214, 215, 218, 235, 307/297, 300; 328/146, 147, 148, 149; 330/30 D

[56] References Cited

UNITED STATES PATENTS

| | | | |
|---|---|---|---|
| 3,364,434 | 1/1968 | Widlar | 330/30 D |
| 3,573,489 | 4/1971 | Sramek | 307/215 |

*Primary Examiner*—Stanley D. Miller, Jr.
*Assistant Examiner*—L. N. Anagnos
*Attorney*—Flehr, Hohbach, Test, Albritton & Herbert

[57] ABSTRACT

A high speed logic circuit includes a differential amplifier driving a shunt feedback output amplifier having an input which acts as an ac ground. The effective Miller capacitance of the differential amplifier is therefore minimized.

3 Claims, 3 Drawing Figures

INVENTOR
DAVID T. KAN
BY Flehr, Hohbach, Test, Albritton & Herbert
ATTORNEYS

HIGH SPEED LOGIC CIRCUIT WITH LOW EFFECTIVE MILLER CAPACITANCE

BACKGROUND OF THE INVENTION

The present invention is directed to a high speed logic circuit with low effective Miller capacitance.

Prior logic circuits have had excessive propagation delays. A partial cause of such delays was the effect of the Miller capacitance of the active components; in other words, a change from one state to another of the logic circuit necessitated a charging of these capacitances.

OBJECT AND SUMMARY OF THE INVENTION

It is, therefore, an object of the present invention to provide a high speed logic circuit with low effective Miller capacitance.

In accordance with the above object there is provided a logic circuit having an output terminal switchable between two levels in response to a bi-level input signal on an input terminal. A differential amplifier is switchable between two states having a reference voltage input and also being coupled to the input terminal of the logic circuit. The amplifier is responsive to a level change in the input signal for switching from one state to another on at least one input terminal. A shunt feedback output amplifier includes shunt feedback means for maintaining an active element of the amplifier continuously on the input terminal of the active element being coupled to the output terminal of the differential amplifier and forming a virtual ac ground. The shunt feedback means is also coupled to the output terminal of the differential amplifier. A change of state of the terminal causes a change of current through the feedback means for providing the two levels of the logic circuit output terminal.

DETAILED DESCRIPTION OF THE PREFERRED EMBODIMENTS

Figure 1:
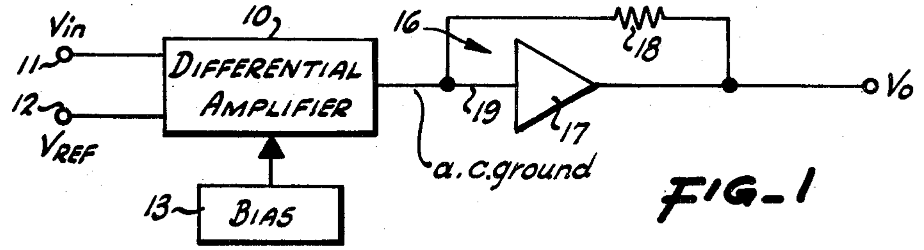
FIG. 1 is a block diagram embodying the present invention.

The basic circuit of the present invention as illustrated in FIG. 1 includes a differential amplifier or current switch 10 having an input terminal 11 responsive to a bi-level input signal to switch the output terminal designated $V_o$ between two logic levels. Amplifier 10 also includes a $V_{reference}$ input on line 12 to provide the differential amplifying action. A bias network 13 is coupled to amplifier 10. A shunt feedback output amplifier 16 includes an amplifying unit 17 with a shunt feedback resistor 18 coupled between the output terminal which is $V_o$ and its input on line 19. Because of the shunt feedback action of resistor 18 which always maintains amplifier 17 in an on or active condition, line 19 is a virtual ac ground. Thus, as will be described below a switching action of differential amplifier 10 does not affect the voltage potential of line 19 and any associated Miller capacitances with the differential amplifier 10 are, therefore, not charged or discharged to cause delay.

Figure 2:
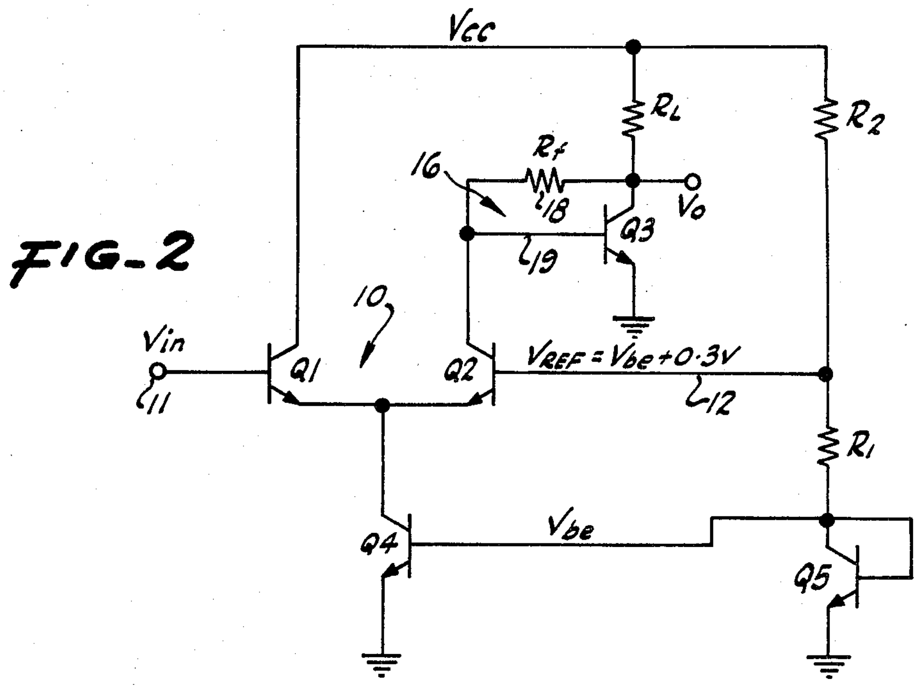
FIG. 2 is a detailed circuit schematic of FIG. 1.

The detailed circuit schematic of FIG. 1 is shown in FIG. 2 where differential amplifier 10 includes transistors Q1 and Q2 which have their emitters coupled together and to a bias current source Q4. The base input of Q1 is the voltage input terminal 11 and the base input of Q2 is the reference line 12. Line 12 is coupled to a diode connected transistor Q5 through series connected resistor R1. The collector of Q5 is also the base input of biasing transistor Q4. This input is always at the $V_{be}$ level because of the diode connection of transistor Q5.

Thus, transistors Q4 and Q5 constitute a diode biased current source for biasing differential amplifier 10. In practice, the entire circuit would be produced in integrated format with transistors Q4 and Q5 being constructed with similar geometry. Since they have the same base to emitter voltage across them the collector current of Q4 will follow the collector current of Q5. Similarly, since the emitter of transistor Q4 is the only path to ground for the differential amplifier transistors Q1 and Q2, any current flow through transistor Q1 or Q2 will be equal to that through transistor Q4.

The base of Q2 is held at the reference voltage $V_{ref}$ which is chosen to be approximately 0.3 volts above $V_{be}$ which is the zero output level at the output terminal $V_o$. The 0.3 volts is provided by the constant current flow through the resistor R1 due to $V_{cc}$.

Feedback output amplifier 16 includes a transistor Q3 and the feedback resistor 18 (also designated $R_f$) coupled between the collector and base terminals. This resistor is chosen so as to always maintain Q3 in an on or conductive condition. The collector of Q3 is also coupled to $V_{cc}$ through resistor R1.

In operation, depending on the bi-level input signal at input terminal 11, either transistor Q1 or Q2 is in a conductive condition. For example, if the input is high, meaning that the base voltage of Q1 is greater than the base voltage to Q1 by substantially 200 mV or $V_{ref}$, Q1 is on and Q2 is off. With Q2 off the output voltage is low because of the inverter action of the logic circuit of the present invention and it is substantially at the level of the base to emitter voltage drop, $V_{be}$, of transistor Q3. The slight base current through $R_f$ can be neglected.

When the input goes low, the differential amplifier switches and Q2 is now on. This causes the collector current of Q2 to flow to ground through Q4 and also through the feedback resistor $R_f$. The collector current $I_{c2}$, of Q2 which is also the current through $R_f$ is as discussed above equal to $I_{c4}$, the collector current of Q4, which in turn because of the diode biased current source configuration equal to the current through Q5 which is $I_{c5}$. In other words, $I_{c5}$ determines the current to Q2. The current through Q5 is merely simply determined by the ratio of $V_{cc} - V_{be}/R1 + R2$.

The output voltage $V_0$ is now determined, with Q2 in its on condition, by the $V_{be}$ of Q3 and the voltage drop across $R_f$ which is $I_{c2}R_f$. Thus, the change of current through $R_f$ provides a two level output at $V_0$ between $V_{be}$ and $V_{be} + I_{c2}R_f$.

However, in accordance with the invention this change of output level does not affect the base input line 19 to Q3 since because of the continuous on condition of Q3 the input is always maintained at $V_{be}$. The switching action of the differential amplifier does not change the voltage level at the collector of Q2 and thus no Miller capacitance associated therewith need be charged or discharged. The same is clearly true at the collector of Q1 which is tied directly to $V_{cc}$. Thus, line 19 forms a virtual ac ground since it is at a constant voltage, $V_{be}$, above ground to provide for an effective low Miller capacitance and therefore high switching speeds.

The circuit of FIG. 2 can be modified to provide a complementary output $V_0$ by adding in the collector circuit of Q1 a similar shunt feedback amplifier 16. In addition, if it is desired to drive the logic circuit of the present invention with a similar type logic circuit a modification can be made to prevent saturation of Q1. Two additional diodes are added, for example of the Schottky barrier type, in the emitter and collector circuits of the shunt feedback transistor Q3. This then prevents saturation of Q1 and the shunt feedback transistor Q3. This is normally accomplished with the alternate complementary configuration.

Figure 3:
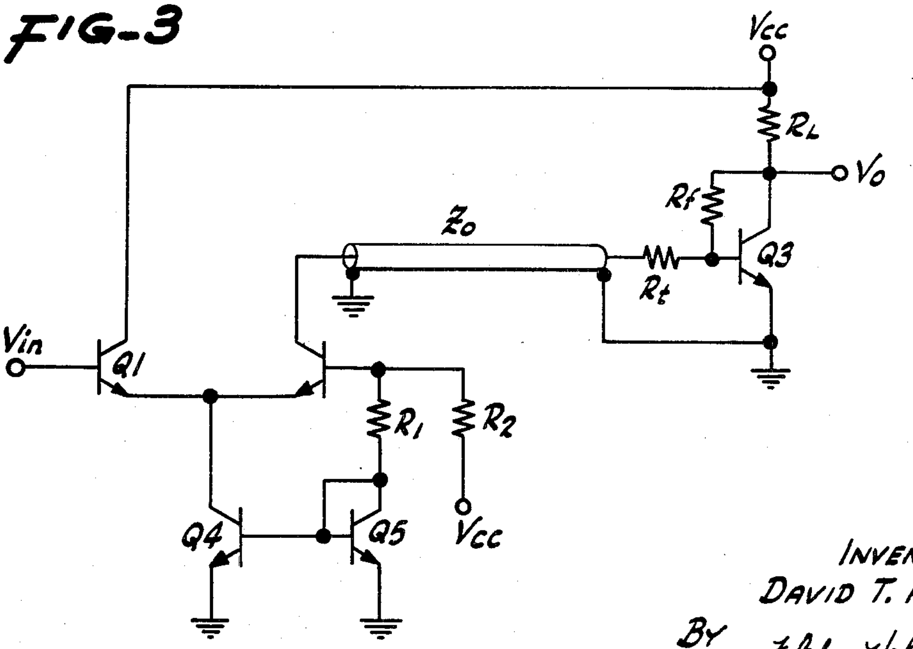
FIG. 3 is an alternate embodiment of FIG. 2.

The circuit of FIG. 2 is also ideally suited, as illustrated in FIG. 3, for use where a transmission line, designated $Z_0$, is necessary between a driving circuit and a driver circuit. A single terminating resistor $R_t$ is connected at the base input to Q3. It is assumed that resistor $R_t$ in conjunction with the input impedance of transistor Q3 is equal to the characteristic impedance of the transmission line. This mode of driving the transmission line may be termed a "terminated series mode." The collector of Q2 is used as a driver for the transmission line. With the present configuration, the transmission line is reasonably terminated at its far end or at the Q3 end and there is therefore no power loss.

Thus, the present invention has provided an improved high speed logic circuit which minimizes the effect of Miller capacitance.

I claim:

1. A logic circuit having an output terminal switchable between two levels in response to a bi-level input signal on an input terminal comprising: a differential amplifier switchable between two states having a reference voltage input and also being coupled to said input terminal of said logic circuit said amplifier being responsive to a level change in said input signal for switching from one state to another on at least one output terminal; a shunt feedback output amplifier including shunt feedback means for maintaining an active element of said amplifier continuously on an input terminal of said active element being coupled to said output terminal of said differential amplifier and forming a virtual ac ground, said shunt feedback means also being coupled to said output terminal of said differential amplifier, a change of state of such terminal causing a change of current through said feedback means for providing said two levels on said logic circuit output terminal.

2. A circuit as in claim 1 where said differential amplifier includes two emitter coupled transistors the collector of one being said differential amplifier output terminal said feedback output amplifier including a transistor and a feedback resistor coupled between its collector and base said base being coupled to said collector of said differential amplifier transistor, conduction of such transistor causing an increase of current through such resistor to switch said output level, said resistor maintaining said transistor of said amplifier continuously conductive whereby the voltage level of the base input of such transistor is maintained constant to form said virtual ac ground.

3. A circuit as in claim 1 together with diode biased current source means for biasing said differential amplifier.

* * * * *